United States Patent
Tonedachi et al.

(10) Patent No.: US 10,217,690 B2
(45) Date of Patent: Feb. 26, 2019

(54) SEMICONDUCTOR MODULE THAT HAVE MULTIPLE PATHS FOR HEAT DISSIPATION

(71) Applicant: KABUSHIKI KAISHA TOSHIBA, Tokyo (JP)

(72) Inventors: Tatsuo Tonedachi, Kanagawa (JP); Eitaro Miyake, Kanagawa (JP); Kentaro Takao, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/228,086

(22) Filed: Aug. 4, 2016

(65) Prior Publication Data
US 2017/0154834 A1    Jun. 1, 2017

(30) Foreign Application Priority Data
Nov. 30, 2015 (JP) .................. 2015-233751

(51) Int. Cl.
*H01L 23/373*    (2006.01)
*H01L 23/495*    (2006.01)
*H01L 23/522*    (2006.01)
*H01L 23/532*    (2006.01)
*H01L 23/538*    (2006.01)
*H01L 25/07*    (2006.01)
*H01L 25/11*    (2006.01)

(52) U.S. Cl.
CPC ...... *H01L 23/373* (2013.01); *H01L 23/49541* (2013.01); *H01L 23/5226* (2013.01); *H01L 23/5386* (2013.01); *H01L 23/53228* (2013.01); *H01L 25/074* (2013.01); *H01L 25/115* (2013.01); *H01L 2224/33* (2013.01); *H01L 2224/37599* (2013.01); *H01L 2224/40* (2013.01); *H01L 2224/48247* (2013.01); *H01L 2924/00014* (2013.01)

(58) Field of Classification Search
CPC . H01L 23/373; H01L 25/074; H01L 23/5386; H01L 23/5226; H01L 23/53228; H01L 23/49541; H01L 25/0655; H01L 23/36; H01L 27/14618; H01L 127/14683; C04B 35/584; C04B 37/021; C04B 37/025; C04B 37/026
USPC .......... 361/767; 257/666, E23.101, E23.105, 257/E25.012, 700, 713, 723, 432; 438/64
See application file for complete search history.

(56) References Cited

U.S. PATENT DOCUMENTS 6,232,657 B1 *    5/2001  Komorita ................ H01L 23/15
                                                              257/700
2005/0067719 A1 *    3/2005  Hayashi ................. H01L 21/565
                                                              257/787

(Continued)

FOREIGN PATENT DOCUMENTS

JP    2006352080 A    12/2006
JP    2013065836 A    4/2013

(Continued)

*Primary Examiner* — Mouloucoulaye Inoussa
(74) *Attorney, Agent, or Firm* — Kim & Stewart LLP (57) ABSTRACT

A semiconductor module includes a substrate, first and second wirings on the substrate, a semiconductor package disposed on the first wiring and having a pair of main electrodes on top and bottom surfaces of the semiconductor package, and a third wiring extending between the top surface of the semiconductor package and the second wiring.

18 Claims, 8 Drawing Sheets (56) References Cited

U.S. PATENT DOCUMENTS

2011/0108971 A1* 5/2011 Ewe .................. H01L 21/56
 257/686
2013/0001792 A1* 1/2013 Uno .................. H01L 23/49524
 257/773

FOREIGN PATENT DOCUMENTS

JP  2013097560 A  5/2013
JP  2013197560 A  9/2013

* cited by examiner

| COMPONENT NAME | MATERIAL | COMPONENT | DENSITY (g/cm3) | SPECIFIC HEAT (J/Gk) | HEAT TRANSFER COEFFICIENTS (W/m·K) |
|---|---|---|---|---|---|
| SEMICONDUCTOR CHIP | Si | Si | 2.32 | 0.73 | 148 |
| ALUMINA INSULATING LAYER | Al2O3 | Al2O3 | 3.7 | 0.8 | 25 |
| MATERIAL MADE OF Cu /CONDUCTOR/METAL LAYER | Cu | Cu | 8.96 | 0.38 | 390 |
| SOLDER LAYER | Sn SERIES | | 7.4 | 0.22 | 64 |
| SILICON GREASE | SILICON OIL | | 2.3 | 0.8 | 1 |
| RESIN INSULATING LAYER | | | 2.7 | 0.86 | 10 |
| HEAT SINK | Al | Al | 2.7 | 0.92 | 238 |

FIG. 8

SEMICONDUCTOR MODULE THAT HAVE MULTIPLE PATHS FOR HEAT DISSIPATION

CROSS-REFERENCE TO RELATED APPLICATION

This application is based upon and claims the benefit of priority from Japanese Patent Application No. 2015-233751, filed Nov. 30, 2015, the entire contents of which are incorporated herein by reference.

FIELD

Embodiments described herein relate generally to a semiconductor module.

BACKGROUND

A conventional semiconductor power module includes, for example, a semiconductor chip mounted on a ceramic plate with copper foil attached to both sides thereof through a solder member. Further, the ceramic plate on which the semiconductor chip mounted is mounted on a metal base substrate through a solder member. A tolerance of such a semiconductor power module against temperature variation and a long-term operation thereof can be improved by adjusting a thermal expansion coefficient of the ceramic plate to be proximate to that of the semiconductor chip.

In the conventional semiconductor power module, however, semiconductor chip is still desirable.

DETAILED DESCRIPTION

According to embodiments, a semiconductor module capable of improving heat irradiation efficiency is provided.

In general, according to one embodiment, a semiconductor module includes a substrate, first and second wirings on the substrate, a semiconductor package disposed on the first wiring and having a pair of main electrodes on top and bottom surfaces of the semiconductor package, and a third wiring extending between the top surface of the semiconductor package and the second wiring.

Hereinafter, embodiments according to the present disclosure will be described with reference to the drawings. In the embodiments described below, characteristic structure and operation of the semiconductor module will be mainly described; however, there can be another structure and operation that is omitted in the following description. This omitted structure and operation is also included in the scope of the embodiments.

First Embodiment

Figure 1:
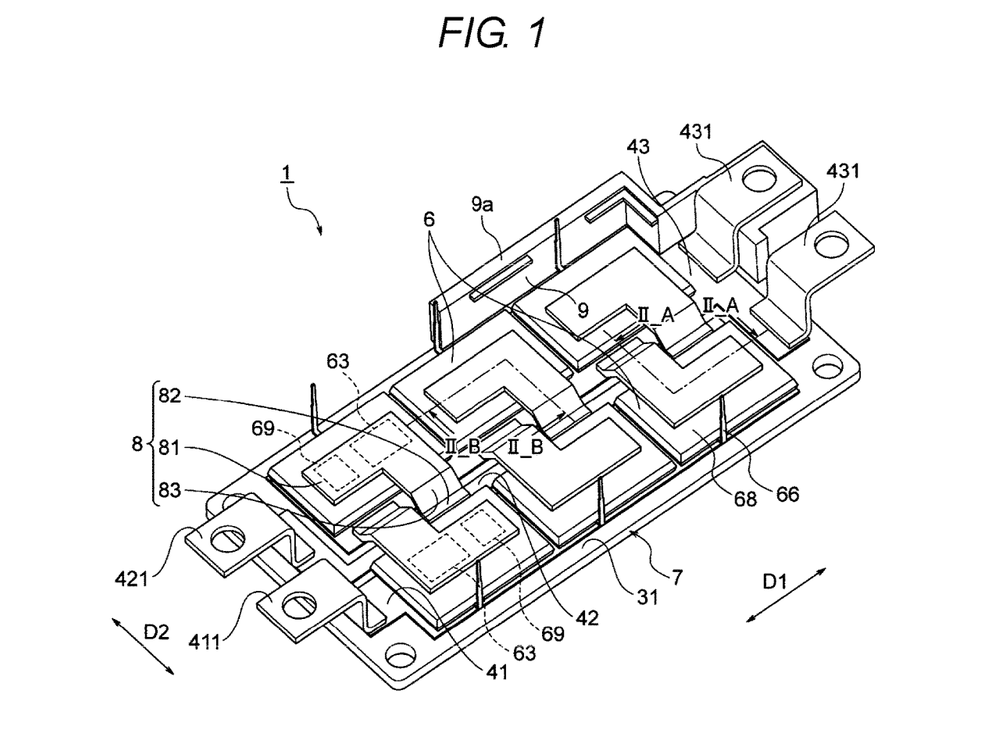
FIG. 1 is a perspective view of a semiconductor module according to a first embodiment.
Figure 2A:
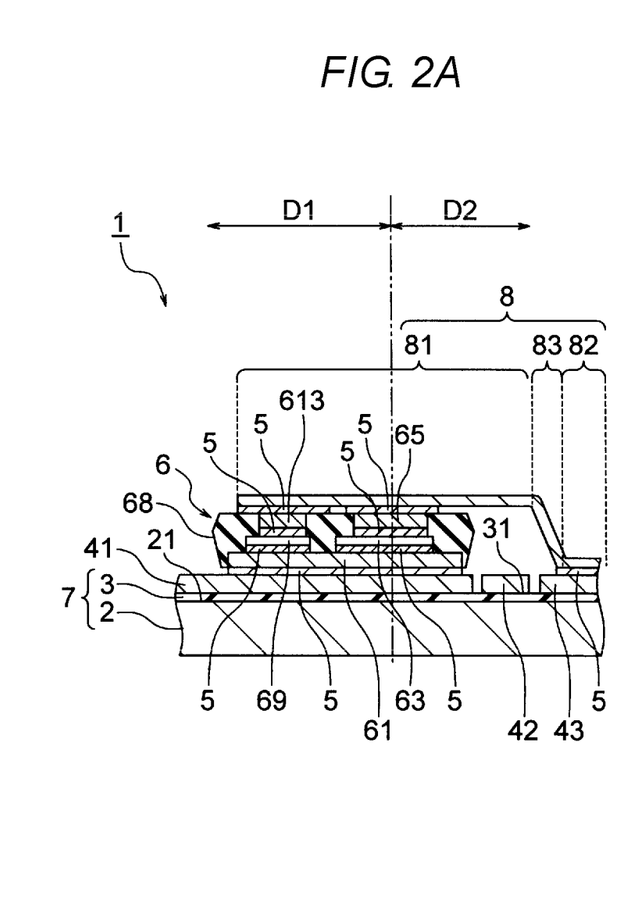
FIG. 2A is a cross-sectional view of the semiconductor module taken along II_A-II_A in FIG. 1.
Figure 2B:
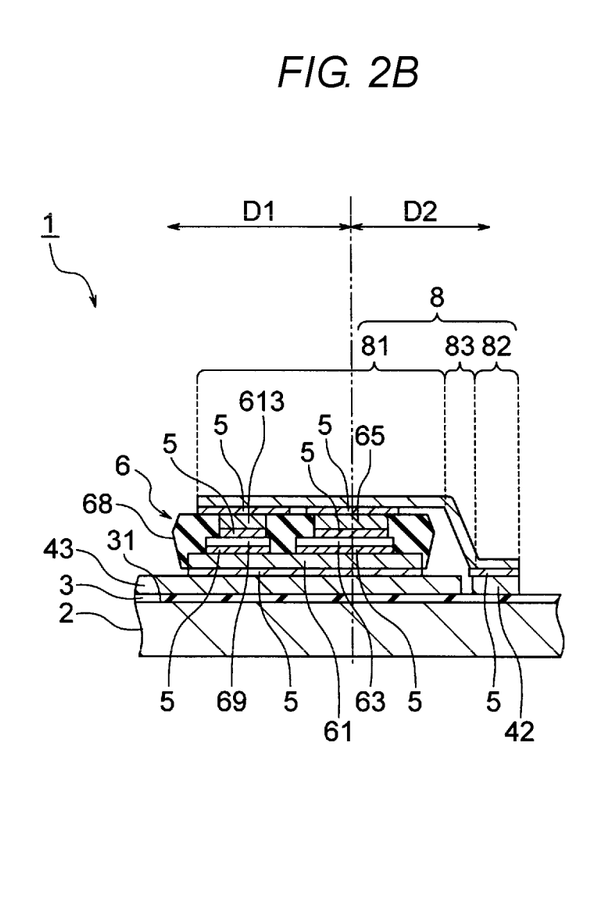
FIG. 2B is a cross-sectional view of the semiconductor module taken along II_B-II_B in FIG. 1.

FIG. 1 is a perspective view of a semiconductor module according to a first embodiment. FIG. 2A is a cross-sectional view of the semiconductor module 1 taken along II_A-II_A in FIG. 1. FIG. 2B is a cross-sectional view of the semiconductor module 1 taken along II_B-II_B in FIG. 1. The semiconductor module 1 can be used for a power converter such as inverter, for example, in a wind turbine generator system, solar power generation system, and train.

As illustrated in FIGS. 1, 2A, and 2B, the semiconductor module 1 according to the first embodiment includes, in the upward order from the bottom layer, a substrate 7 including a metal layer 2 and an insulating layer 3, conductors 41 to 43 at a positive electrode side, a negative electrode side, and an output side, respectively, a semiconductor package 6 mounted over the conductor 41 or the conductor 43 through a solder layer 5, and a third wiring 8 mounted over the semiconductor package 6 through the solder layer 5. The conductor 41 at a positive electrode side may be a first wiring, and in this case, the conductor 43 at an output side is a second wiring. Alternatively, when the conductor 43 at an output side is the first wiring, the conductor 42 at a negative electrode side is the second wiring.

Figure 3:
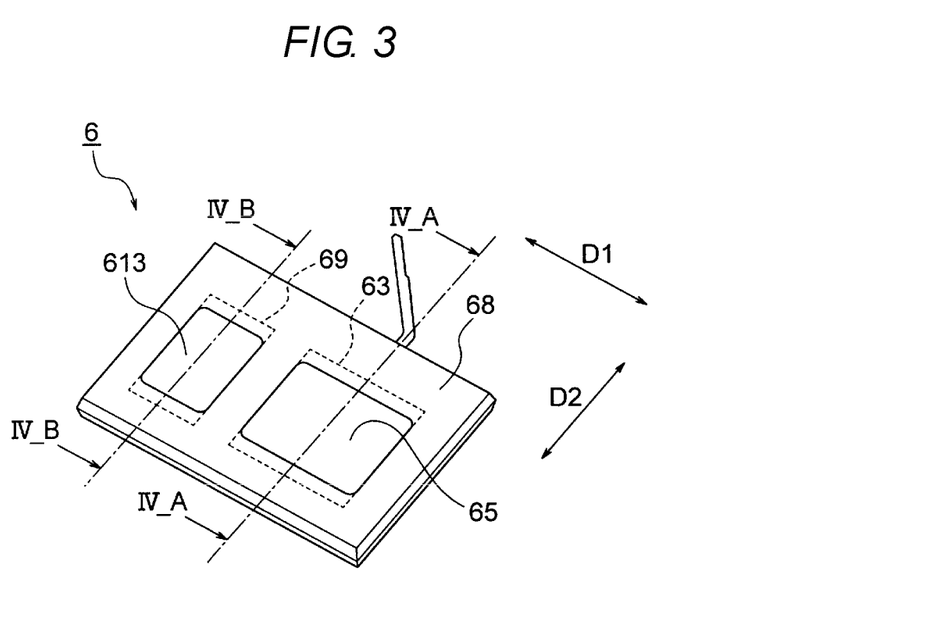
FIG. 3 is a perspective view of a semiconductor package of the semiconductor module according to the first embodiment.
Figure 4A:
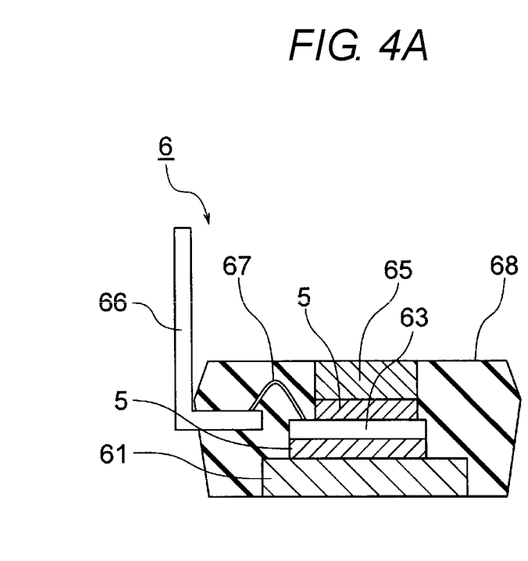
FIG. 4A is a cross-sectional view of the semiconductor package taken along IV_A-IV_A in FIG. 3.

FIG. 3 is a perspective view of the semiconductor package 6 shown in FIG. 1. FIG. 4A shows a cross section of the semiconductor package 6 taken along IV_A-IV_A in FIG. 3. As shown in FIG. 4A, the semiconductor package 6 includes a first member 61, an insulated gate bipolar transistor (IGBT) 63 mounted over the first member 61 through the solder layer 5, and a second member 65 mounted over the IGBT 63 through the solder layer 5. The semiconductor package 6 is a surface mounted type, and the first member 61 and the second member 65 respectively form electrodes. The IGBT 63 is an example of the first semiconductor chip, and another semiconductor chip such as MOSFET and diode may be alternatively used as the first semiconductor chip. The semiconductor package 6 includes a lead frame 66, a bonding wire 67 connecting the IGBT 63 to the lead frame 66, and a sealing resin 68 as an example of a sealing material.

Figure 4B:
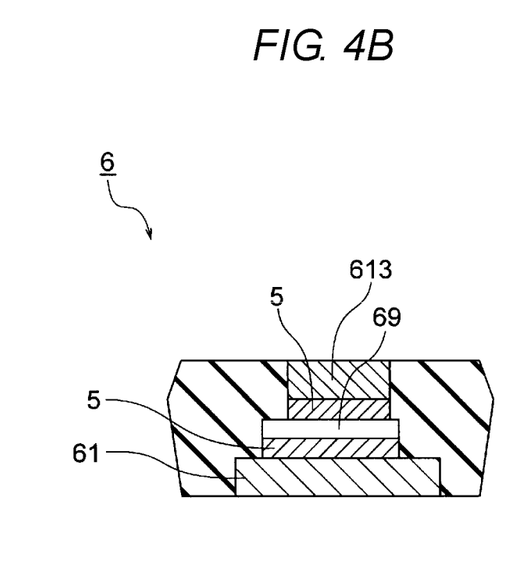
FIG. 4B is a cross-sectional view of the semiconductor package taken along IV_B-IV_B in FIG. 3.

FIG. 4B shows a cross section of the semiconductor package 6 taken along IV_B-IV_B in FIG. 3. Specifically, the semiconductor package 6 includes the first member 61, a diode 69 mounted over the first member 61 through the solder layer 5, and a fourth member 613 mounted over the diode 69 through the solder layer 5. The diode 69 is an example of the second semiconductor chip, and another semiconductor chip such as MOSFET and IGBT may be alternatively used as the second semiconductor chip.

As shown in FIGS. 4A and 4B, the first member 61, the second member 65, and the fourth member 613 each have an exposed portion on surfaces of the semiconductor package 6. The exposed portions are connected to the conductors 41 and 43 or the third wiring 8 through the solder layer 5.

As shown in FIG. 1, the semiconductor module 1 includes a frame-shaped case 9 along the outer periphery of the substrate 7 as an example of the enclosure. The case 9 is provided to support the substrate 7 and cover the lateral side of the substrate 7. In FIG. 1, only a portion of the case 9 is illustrated. The upper end 9a of the case 9 is positioned upper than the third wiring 8. An area surrounded by the case 9 on the substrate 7 is sealed by a resin (not illustrated). The top portion of the case 9 may be covered with a lid.

Hereinafter, each component of the semiconductor module 1 will be described in detail.

(Substrate 7)

As shown in FIG. 1, the substrate 7 has a rectangular shape. The substrate 7 has a long side in the direction D1 and a short side in the direction D2 substantially vertical to the direction D1. Hereinafter, the direction D1 is defined as a length direction of the semiconductor module 1, and the direction D2 is defined as a width direction of the semiconductor module 1.

As shown in FIG. 1, the substrate 7 has an area enough to contain a plurality of semiconductor packages 6. In FIG. 1, the total of six semiconductor packages 6 can be arranged on the substrate 7, with three in the length direction D1 and two in the width direction D2.

The metal layer 2 forming the substrate 7 contains copper as a main component. Therefore, compared with the case of containing alumina as the main component, a manufacturing cost can be more reduced. However, the metal layer 2 may contain aluminum as the main component. Further, the metal layer 2 may contain metal and ceramic (for example, a composite material of aluminum and silicon carbide) as the main component.

As shown in FIG. 2A, the insulating layer 3 forming the substrate 7 is in contact with the whole top surface of the metal layer 2. The insulating layer 3 contains resin.

The insulating layer 3 preferably contains a filler. The filler may be, for example, boron nitride, alumina, aluminum nitride, silicon nitride, or silicon carbide.

The insulating layer 3 has a thermal conductivity, for example, of 8 W/m·K or more, and by including the filler, the thermal resistance can be reduced. The insulating layer 3 may have an dielectric strength of 17 kV/mm or more. By using the substrate 7 including the metal layer 2 and the insulating layer 3, compared with a ceramic plate, a manufacturing cost can be reduced. Further, the substrate 7 has a heat irradiation function and at the same time, works as the supporting substrate of the semiconductor module. In other words, the substrate 7 also has a function similar to a conventional metal-base substrate. Accordingly, in the present embodiment, a metal base substrate may not be necessary.

(Conductors 41 to 43)

As shown in FIGS. 2A and 2B, the conductors 41 to 43 extending in the length direction D1 are provided on the top surface 31 of the insulating layer 3 in contact therewith and used as a wiring.

As shown in FIG. 1, a positive electrode terminal 411 is connected to one end of the conductor 41 at the positive electrode side. The size of the conductor 41 at the positive electrode side in the width direction D2 is substantially same as that of the semiconductor package 6 in the width direction D2. Three semiconductor packages 6 are arranged on the conductor 41 at the positive electrode side with space therebetween in the length direction D1.

The conductor 43 at the output side is spaced apart from the conductor 41 at the positive electrode side and the conductor 42 at the negative electrode side in the width direction D2, respectively. Two output terminals 431 are connected to one end of the conductor 43 at the output side. Three semiconductor packages 6 are arranged on the conductor 43 at the output side with space therebetween in the length direction D1. The semiconductor package 6 on the conductor 43 at the output side faces the semiconductor package 6 on the conductor 41 at the positive electrode side.

The conductor 42 at the negative electrode side is arranged between the conductor 41 at the positive electrode side and the conductor 43 at the output side. A negative electrode terminal 421 is connected to one end of the conductor 42 at the negative electrode side. The size of the conductor 42 at the negative electrode side in the width direction D2 is smaller than the size of each of the conductor 41 at the positive electrode side and the conductor 43 at the output side in the width direction D2. A third wiring 8 is connected to the conductor 42 at the negative electrode side.

The conductors 41 to 43 contain, for example, metal as a main component, and preferably contain copper as the main component. According to this configuration, the conductors 41 to 43 can reduce a thermal resistance while keeping electrical conductivity.

(Semiconductor Package 6)

(First Member 61)

Both the first member 61 of the semiconductor package 6 over the conductor 41 at the positive electrode side and the first member 61 of the semiconductor package 6 over the conductor 43 at the output side have a substantially rectangular plate shape in parallel to the substrate 7. The first member 61 has electrical conductivity and thermal conductivity, and contains, for example, metal as a main component, which is preferably copper.

As shown in FIG. 2A, the first member 61 at the positive electrode side is electrically and mechanically connected to the conductor 41 at the positive electrode side through the solder layer 5. The solder layer 5 has electrical conductivity and thermal conductivity. Alternatively, the first member 61 at the positive electrode side may be electrically and mechanically connected to the conductor 41 at the positive electrode side through a material mainly containing a metal.

As shown in FIG. 2B, the first member 61 at the output side is electrically and mechanically connected to the conductor 43 at the output side through the solder layer 5. Alternatively, the first member 61 at the output side may be electrically and mechanically connected to the conductor 43 at the output side through the material mainly containing a metal.

(IGBT 63)

As shown in FIGS. 2A and 2B, the IGBT 63 is electrically and mechanically connected to the first member 61 through the solder layer 5. More specifically, a collector electrode (not illustrated) is provided on the lower surface of the IGBT 63 and the collector electrode is connected to the first member 61. An emitter electrode and a gate electrode (not illustrated) are provided on the top surface of the IGBT 63. As shown in FIG. 4A, one end of the bonding wire 67 is connected to the gate electrode and the other end is connected to the lead frame 66.

(Second Member 65)

As shown in FIGS. 2A, 2B, and 3, the second member 65 has a substantially rectangular plate shape in parallel to the substrate 7. The second member 65 has electrical conductivity and thermal conductivity, and contains metal as a main component, which is preferably copper.

The second member 65 is electrically and mechanically connected to the top surface of the IGBT 63 through the solder layer 5. More specifically, the second member 65 is connected to the emitter electrode of the IGBT 63.

According to the above structure, the second member 65 can irradiate the heat generated in the IGBT 63 upward.

(Component at Side of Diode 69)

As shown in FIGS. 2A and 2B, the diode 69 is electrically and mechanically connected to the first member 61 through the solder layer 5. An cathode electrode (not illustrated) is provided on the lower surface of the diode 69, and the diode 69 is connected to the first member 61 in the cathode electrode.

As shown in FIGS. 2A, 2B, and 3, the fourth member 613 has a substantially rectangular plate shape in parallel to the substrate 7, and contains, for example, metal as a main component, which is preferably copper. The fourth member 613 is electrically and mechanically connected to the diode 69 through the solder layer 5. More specifically, a cathode electrode (not illustrated) is provided on the top surface of the diode 69, and the anode electrode is connected to the fourth member 613.

The sealing resin 68 seals the stacked structure at a side of the IGBT 63 and the stacked structure at a side of the diode 69. At least a portion of the first member 61, for example, a bottom surface thereof, is exposed on the surface of the sealing resin 68, and at least a portion of the second member 65 provided over the top surface of the IGBT 63, for example, a top surface thereof is exposed on the surface of the sealing resin 68. According to this structure, the semiconductor package 6 can irradiate the heat from the top surface and the bottom surface. Similarly, at least a portion of the fourth member 613, for example, a top surface thereof is, exposed on the sealing resin 68. The sealing resin 68 is formed in a transfer molding method.

As illustrated in FIG. 1, the semiconductor package 6 over the conductor 41 at the positive electrode side is arranged over the metal layer 2, so that the IGBT 63 may be positioned nearer to the side of the positive electrode terminal 411 than the diode 69. On the other hand, the semiconductor package 6 over the conductor 43 at the output side is arranged over the metal layer 2, so that the diode 69 may be positioned nearer to the side of the negative electrode terminal 421 than the IGBT 63. In other words, the IGBT 63 in the semiconductor package 6 over the conductor 41 at the positive electrode side faces the diode 69 in the semiconductor package 6 over the conductor 43 at the output side.

The specific structure of the semiconductor package 6 is not restricted to the structure shown in FIGS. 4A and 4B. The semiconductor package 6 may include MOSFET instead of the IGBT 63 formed on a silicon substrate. The MOSFET or the IGBT 63 may be formed on a GaN substrate or a SiC substrate. In the semiconductor package 6, the diode 69 may not be necessary.

(Third Wiring 8)

As shown in FIG. 1, the third wiring 8 has a substantially L-shape in plan view and includes a first portion 81 which is connected to the second member 65 and the fourth member 613 exposed on the top surface of the semiconductor package 6, a second portion 82 which is connected to the conductor 42 at the negative electrode side, and a third portion 83 that connects the first portion 81 and the second portion 82. When the diode 69 is not provided in the package 6, the third wiring 8 does not have to be in the L-shape.

As shown in FIGS. 2A and 2B, the first portion 81 has a plate shape in parallel to the substrate 7 and extends from the top surface of the fourth member 613 across the top surface of the second member 65 in the length direction D1. Further, the first portion 81 extends from the top of the second member 65 in a direction towards the conductor 42, namely, extends inward to in the width direction D2 to have an L-shape. The first portion 81 is electrically and mechanically connected to the second member 65 and the fourth member 613 through the solder layer 5. More specifically, the first portion 81 is connected to the whole surface including the top surface of the second member 65 and the top surface of the fourth member 613, and has a width larger than each width of the second member 65 and the fourth member 613 in the width direction D2. The first portion 81 may be electrically and mechanically connected to the second member 65 and the fourth member 613 through the material mainly containing a metal.

The third portion 83 extends from the inner end of the first portion 81 in the width direction D2 inward and downward in the width direction D2. In short, the third portion 83 is inclined downward from the first portion 81.

As shown in FIG. 2A, in the third portion 83 connected to the semiconductor package 6 over the conductor 41 at the positive electrode side (hereinafter, also referred to as the third portion 83 at the positive electrode side), the lower end thereof is located at the vicinity of the conductor 43 at the output side.

As shown in FIG. 2B, in the third portion 83 connected to the semiconductor package 6 over the conductor 43 at the output side (hereinafter, also referred to as the third portion 83 at the output side), the lower end thereof is located at the vicinity of the conductor 42 at the negative electrode side.

The second portion 82 has a plate shape in parallel to the substrate 7. As shown in FIG. 2A, the second portion 82 of the third wiring 8 at the positive electrode side (hereinafter, also referred to the second portion 82 at the positive electrode side) is jointed to the lower end of the third portion 83 at the positive electrode side. The second portion 82 at the positive electrode side is electrically and mechanically connected to the conductor 43 at the output side through the solder layer 5. More specifically, the second portion 82 at the positive electrode side is connected to the conductor 43 at the output side in the whole bottom area. Alternatively, the second portion 82 at the positive electrode side may be electrically and mechanically connected to the conductor 43 at the output side through the material mainly containing a metal.

As shown in FIG. 2B, the second portion 82 of the third wiring 8 at the output side (hereinafter, also referred to as the second portion 82 at the output side) is jointed to the lower end of the third portion 83 at the output side. The second portion 82 at the output side is electrically and mechanically connected to the conductor 42 at the negative electrode side through the solder layer 5. More specifically, the second portion 82 at the output side is connected to the conductor 42 at the negative electrode side in the whole bottom area. Alternatively, the second portion 82 at the output side may be electrically and mechanically connected to the conductor 42 at the negative electrode side through the material mainly containing a metal.

Provided with a thermal conductivity, connected to the second member 65 in the whole top area and connected to the conductor 43 at the output side in the whole bottom area, the third wiring 8 at the positive electrode side can irradiate the heat of the IGBT 63 transmitted to the second member 65 efficiently to the conductor 43 at the output side and the metal layer 2.

Further, since the third wiring 8 has a thermal conductivity and is connected to the second member 65 in the whole top area and connected to the conductor 42 at the negative electrode side in the whole bottom area, the third wiring 8 at the output side can irradiate the heat of the IGBT 63 transmitted to the second member 65 efficiently to the conductor 42 at the negative electrode side.

(Equivalent Circuit)

Figure 5:
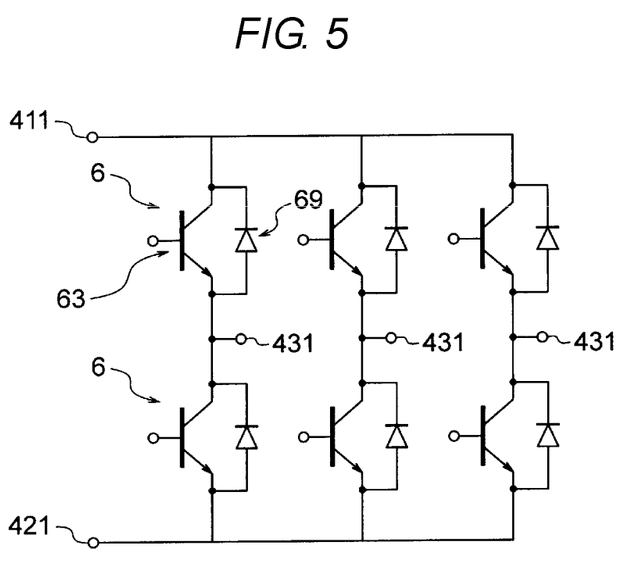
FIG. 5 is an equivalent circuit diagram of the semiconductor module according to the first embodiment.

FIG. 5 is an equivalent circuit diagram of the semiconductor module 1 according to the first embodiment. As shown in FIG. 5, in each semiconductor package 6, the IGBT 63 and the diode 69 are connected reversely in parallel to each other. The IGBTs 63 connected to the positive electrode terminal 411 are connected in parallel to each other and the diodes 69 are connected in parallel. Further, the IGBTs 63 connected to the negative electrode terminal 421 are connected in parallel to each other and the diodes 69 are connected in parallel. The IGBT 63 and the diode 69 in the semiconductor package 6 over the conductor 41 at the positive electrode side and the IGBT 63 and diode 69 in the semiconductor package 6 over the conductor 43 at the output side are connected in series through the third wiring 8 at the positive electrode side.

The semiconductor package 6 over the conductor 41 at the positive electrode side can be used as, for example, an upper arm of an inverter. The semiconductor package 6 over the conductor 43 at the output side can be used as, for example, a lower arm of the inverter.

(Heat Irradiation of Semiconductor Module 1)

The semiconductor module 1 configured as described above can irradiate the heat generated in the IGBT 63 as follows.

When operating the three semiconductor module 1 as the inverter, the positive electrode terminals 411 and the negative electrode terminals 421 are respectively connected to the positive electrode and the negative electrode of the direct current power source. Further, the output terminals 431 are respectively connected to, for example, a U-terminal, a V-terminal, and a W-terminal of three phase motor. The lead frames 66 are connected to a control unit of controlling input signals to the gate. A direct-current (DC) voltage is applied to between the positive electrode terminal 411 and the negative electrode terminal 421 from a DC power source, to perform the switching control on the IGBT 63 according to the input signal to the gate, thereby converting the direct current power into three-phase alternating current (AC) power. The converted three-phase AC power is output from the output terminal 431 to the three phase motor.

During the above-described operation of the semiconductor module 1, the IGBT 63 generates heat through the switching control.

As shown in FIG. 2A, under the IGBT 63 of the semiconductor package 6 over the conductor 41 at the positive electrode side, there is a heat irradiation path passing through the solder layer 5, the first member 61, the solder layer 5, and the conductor 41 at the positive electrode side, and the insulating layer 3 in this order and reaching the metal layer 2. As shown in FIG. 2B, under the IGBT 63 in the semiconductor package 6 over the conductor 43 at the output side, there is a heat irradiation path passing through the solder layer 5, the first member 61, the solder layer 5, the conductor 43 at the output side, and the insulating layer 3 in this order and reaching the metal layer 2. Accordingly, the heat generated in the IGBT 63 can be irradiated downward through the heat irradiation path under the IGBT 63.

Further, as shown in FIG. 2A, above the IGBT 63 in the semiconductor package 6 over the conductor 41 at the positive electrode side, there is a heat irradiation path passing through the solder layer 5, the second member 65, the solder layer 5, the third wiring 8, the solder layer 5, the conductor 43 at the output side, and the insulating layer 3 in this order and reaching the metal layer 2. As shown in FIG. 2B, above the IGBT 63 in the semiconductor package 6 over the conductor 43 at the output side, there is a heat irradiation path passing through the solder layer 5, the second member 65, the solder layer 5, the third wiring 8, the solder layer 5, the conductor 42 at the negative electrode side the insulating layer 3 in this order and reaching the metal layer 2. Accordingly, the heat generated in the IGBT 63 can be irradiated upwardly through the heat irradiation path above the IGBT 63.

Experiment Example

Figure 6A:
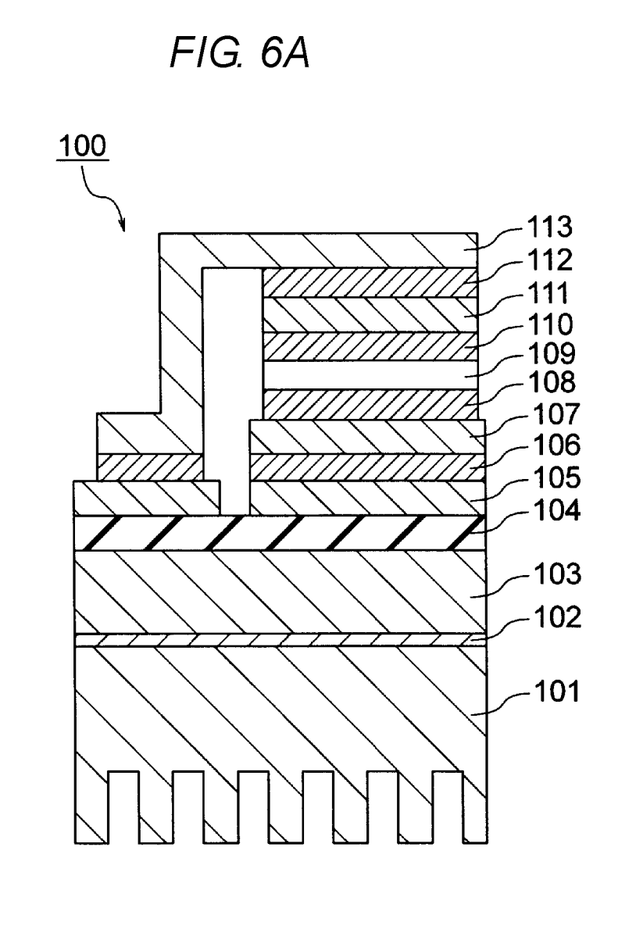
FIG. 6A is a cross-sectional view of a stacked structure for simulation of the semiconductor module according to the first embodiment.
Figure 6B:
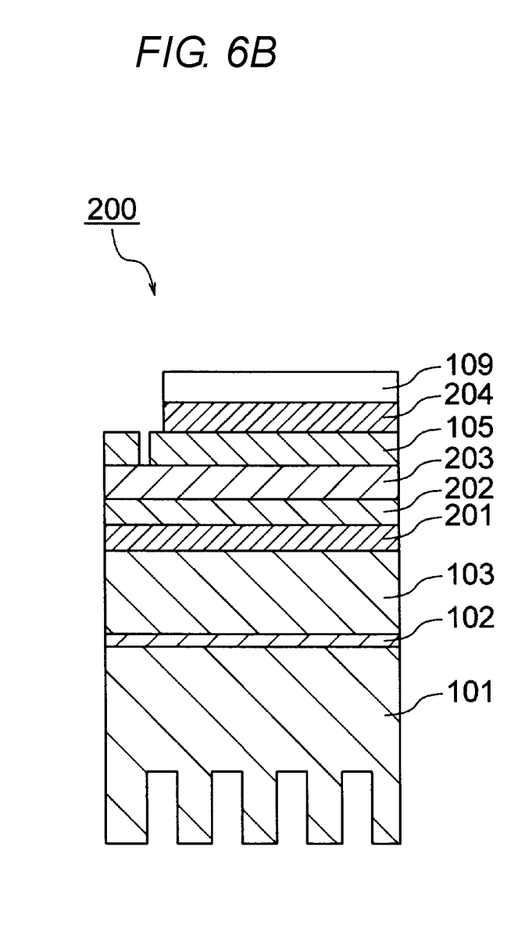
FIG. 6B is a cross-sectional view of a stacked structure for simulation of a semiconductor module according to a comparison example.

Next, an experiment example of the first embodiment will be described. FIG. 6A is a cross-sectional view of a stacked structure 100 for simulation (hereinafter, also referred to as a stacked structure of the first embodiment) of the semiconductor module 1 according to the first embodiment. FIG. 6B is a cross-sectional view of a stacked structure 200 for simulation (hereinafter, also referred to a stacked structure of the comparison example) of the semiconductor module according to a comparison example.

In the experiment, as target data for simulation, the stacked structure 100 of the first embodiment and the stacked structure 200 of the comparison example are formed and a heat transfer simulation is performed on the both stacked structures 100 and 200 under the following conditions.

As shown in FIG. 6A, the stacked structure 100 of the first embodiment includes, in the order from the bottom layer, a heat sink 101, a silicone grease 102, a substrate including a metal layer 103 made of Cu and an insulating layer 104 of resin provided on the silicone grease, a conductor 105 of Cu, a solder layer 106, a member 107 of Cu, a solder layer 108, a semiconductor chip 109, a solder layer 110, a member 111 of Cu, a solder layer 112, and a member 113 of Cu. The metal layer 103 of Cu is analogous to the metal layer 2. The conductor 105 of Cu is analogous to the conductors 41 to 43. The member 107 of Cu is analogous to the first member 61. The semiconductor chip 109 is analogous to the IGBT 63. The member plate 111 of Cu is analogous to the second member 65. The member 113 of Cu is analogous to the third wiring 8.

As shown in FIG. 6B, the stacked structure 200 of the comparison example includes, in the order from the bottom layer, the heat sink 101, the silicone grease 102, a Cu-base substrate 103, a solder layer 201, a Cu layer 202, an alumina insulating layer 203, a Cu wiring 105, a solder layer 204, and a semiconductor chip 109.

Figure 7:
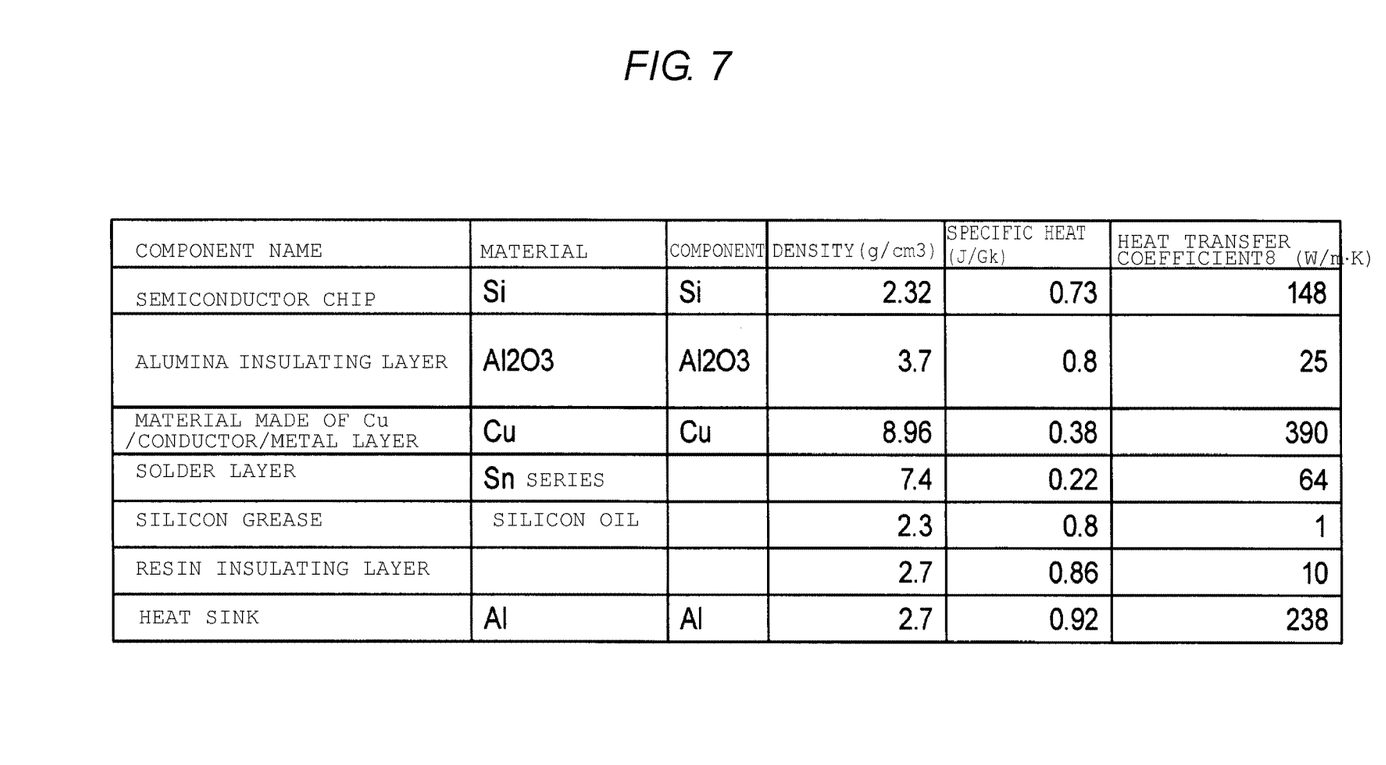
FIG. 7 is a table illustrating physical properties of the stacked structure for simulation of the semiconductor module according to the first embodiment and the stacked structure for simulation of the semiconductor module according to the comparison example.

FIG. 7 illustrates physical properties of the stacked structure 100 of the first embodiment and the stacked structure 200 of the comparison example. Each layer of the stacked structures 100 and 200 has the material, component, and physical properties (density, specific heat, and heat transfer coefficient) as shown in FIG. 7.

The simulation is performed under the condition that the semiconductor chip 109 of the stacked structures 100 and 200 generates heat with a calorific value of 100 W. Further, it is conditioned that the heat sink 101 cools the semiconductor chip 109 with the cooling ability of 400 W/m²·K.

As the result of the simulation under the above-described conditions, it is found that the stacked structure 100 of the first embodiment can reduce the thermal resistance by about 22%, compared with the stacked structure 200 of the comparison example. Different from the stacked structure 200 of the comparison example, since the stacked structure 100 of the first embodiment has not only the heat irradiation path to a side of the lower layer from the semiconductor chip 109 but also the heat irradiation path to a side of the upper layer from the semiconductor chip 109, it is considered that the thermal resistance can be improved in the stacked structure 100 of the first embodiment.

As described above, the semiconductor module 1 according to the first embodiment has not only the downward heat irradiation path from the IGBT 63 but also the upward heat irradiation path from the IGBT 63 by including the second member 65 and the third wiring 8 in the upper layer of the IGBT 63. This structure can improve the heat irradiation efficiency.

According to the semiconductor module 1 of the first embodiment, the IGBT 63, the first member 61, and the second member 65 are securely sealed by the sealing resin 68. Accordingly, no thermal deformation is likely to occur in the first member 61 and the second member 65 each having a different linear expansion coefficient as for the IGBT 63, and breaking of the IGBT 63 caused by the thermal deformation of the members in the conventional structure can be suppressed. In the conventional structure, since the Cu wiring 105 provided on the top surface of the ceramic substrate is formed by etching, the thickness thereof has an upper limit. To the contrary, the first member 61 and the second member 65 according to the present embodiment are pressed components. For that reason, the first member 61 and the second member 65 can be made thicker than in the conventional structure. As the result, the transient heat generated in the IGBT 63 can be quickly irradiated by the first member 61 and the second member 65, thereby further improving the heat irradiation efficiency.

Further, the semiconductor module 1 according to the first embodiment can reduce the inductance by using the third wiring 8, which is thicker than the bonding wire.

Further, according to the semiconductor module 1 of the first embodiment, the IGBT 63 is positioned nearer to the second portion 82 than the diode 69. Accordingly, a transfer distance of the heat from the IGBT 63 to the substrate 7 through the first portion 81 to the third portion 83 is shorter than the distance from the diode 69. According to this structure, the thermal resistance of the third wiring 8 against the heat from the IGBT 63 can be suppressed, thereby improving the heat irradiation efficiency. Further, the third portion 83 is inclined directly to the second portion 82. According to this structure, the transfer distance of the heat from the IGBT 63 within the third wiring 8 can be made shorter, thereby further improving the heat irradiation efficiency.

The semiconductor module 1 according to the first embodiment can reverse a mutual relative position of the IGBT 63 and the diode 69 between the semiconductor package 6 over the conductor 41 at the positive electrode side and the semiconductor package 6 over the conductor 43 at the output side, as shown in FIG. 1. In other words, the IGBT 63 in the semiconductor package 6 over the conductor 41 at the positive electrode side faces the diode 69 in the semiconductor package 6 over the conductor 43 at the output side. Therefore, the third wiring 8 at the positive electrode side and the third wiring 8 at the output side can be positioned efficiently in a space over the metal layer 2 by turning the positive electrode side wiring 8 to the other at 180°.

When performing a switching test on the IGBT, a ceramic substrate with the semiconductor chip 109 mounted has to be subjected to the test in a state where the ceramic substrate is mounted in a metal base substrate. To the contrary, the semiconductor module 1 according to the first embodiment can perform the switching test by the unit of the semiconductor package 6, because the semiconductor chip 109 is sealed as a package. This can improve the convenience. Further, since the lead frame 66 as a signal terminal can be directly taken out from the semiconductor package 6, it is not necessary to provide the metal layer 2 of the substrate 7 with a signal terminal. Further, a pressed component made of Cu with a thickness of 1 mm or more is used for the first member 61 and the second member 65 provided below and above the IGBT 63 in the semiconductor package 6. The semiconductor package 6 having this thick material can be assembled in the semiconductor module 1, and therefore, the heat from IGBT 63 can be efficiently irradiated. In short, by assembling the semiconductor package 6, the semiconductor module 1 can irradiate the heat more efficiently than the conventional one.

Second Embodiment

Figure 8:
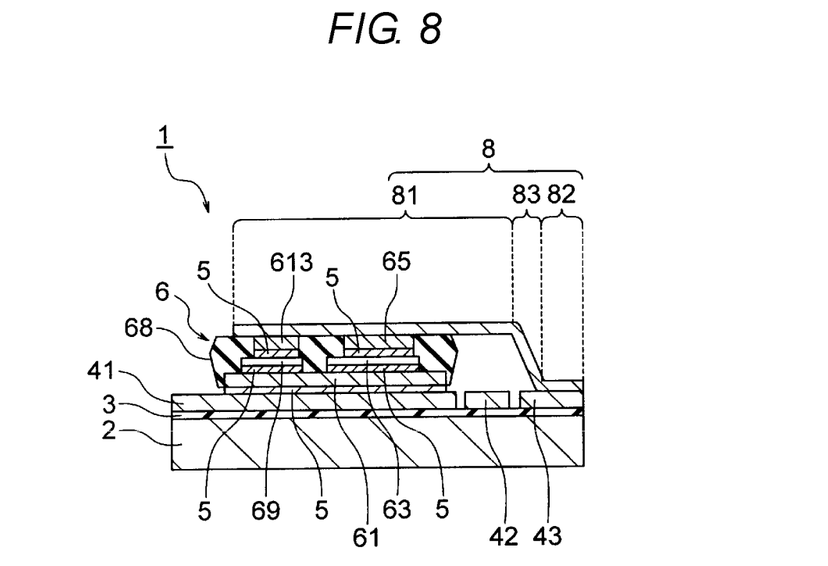
FIG. 8 is a cross-sectional view of a semiconductor module according to a second embodiment.

A second embodiment will be described mainly with difference from the first embodiment. FIG. 8 is a cross-sectional view of a semiconductor module 1 according to the second embodiment. FIG. 8 is a cross-sectional view corresponding to FIG. 4A, showing the structure of the semiconductor package 6 over the conductor 41 at the positive electrode side and the periphery thereof.

As shown in FIG. 8, in the second embodiment, the second member 65 is directly connected to the first portion 81 of the third wiring 8 by an ultrasonic bonding not through the solder layer.

Further, the second portion 82 of the third wiring 8 is directly connected to the conductor 43 at the output side by the ultrasonic bonding not through the solder layer.

Although it is not illustrated, in the semiconductor package 6 over the conductor 43 at the output side, the second member 65 and the first portion 81 may be directly jointed together by the ultrasonic bonding, and the second portion 82 and the conductor 42 at the negative electrode side may be directly jointed together by the ultrasonic bonding. The first member 61 at the positive electrode side may be electrically and mechanically connected to the conductor 41 at the positive electrode side directly, not through the solder layer, by the ultrasonic bonding. The first member 61 at the output side may be electrically and mechanically connected to the conductor 43 at the output side directly, not through the solder layer, by the ultrasonic bonding.

The semiconductor module 1 according to the second embodiment also achieves the same advantage as the one according to the first embodiment. Especially, the heat irradiation efficiency of the semiconductor module 1 can be improved.

In the first and the second embodiments, silver nano paste may be used instead of the solder layer 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module, comprising:
 a substrate comprising a metal layer and an insulating layer on the metal layer, the insulating layer comprising a resin and a filler, the filler comprising at least one of boron nitride, alumina, aluminum nitride, silicon nitride, and silicon carbide;
 a case along an outer periphery of the substrate;
 first and second wirings on the substrate;
 a first semiconductor package disposed on the first wiring; and
 a third wiring including a planar portion and bent portion, the third wiring being outside of the first semiconductor package and connecting to a top surface of the first semiconductor package and the second wiring, wherein the first semiconductor package comprises:
  a first main electrode having a first surface in a same plane as the top surface of the first semiconductor package, the first surface being exposed from the first semiconductor package;
  a second main electrode having a second surface located in a same plane as a bottom surface of the first semiconductor package, the second surface being exposed from the first semiconductor package;
  a semiconductor element between the first and second main electrodes; and
  a material sealing the first and second main electrodes and the semiconductor element.

2. The semiconductor module according to claim 1, wherein the insulating layer has a thermal conductivity of 8 W/m·K or more.

3. The semiconductor module according to claim 1, wherein, the material is formed in a transfer molding method.

4. The semiconductor module according to claim 1, wherein the third wiring is electrically connected to the top surface of the first semiconductor package through a solder member.

5. The semiconductor module according to claim 1, wherein the third wiring is electrically connected to the top surface of the first semiconductor package through silver nano paste.

6. The semiconductor module according to claim 1, wherein the third wiring is in contact with the top surface of the first main electrode.

7. The semiconductor module according to claim 1, wherein
 the first wiring is electrically connected to the bottom surface of the first semiconductor package through a solder member.

8. The semiconductor module according to claim 1, wherein
 the first wiring is electrically connected to the bottom surface of the first semiconductor package through silver nano paste.

9. The semiconductor module according to claim 1, wherein a thickness of at least one of the first, the second, and the third wiring is equal to or more than 1 mm.

10. The semiconductor module according to claim 1, wherein the third wiring has a L-shape.

11. The semiconductor module according to claim 1, the third wiring includes a first portion extending above the top surface of the first semiconductor package, a second portion extending above the second wiring layer, and a third portion extending between the first portion and the second portion.

12. The semiconductor module according to claim 1, further comprising:
 a second semiconductor package disposed on the second wiring and having a pair of main electrodes on top and bottom surfaces of the second semiconductor package;
 a fourth wiring on the substrate; and
 a fifth wiring extending between the top surface of the second semiconductor package and the fourth wiring, wherein the first and the second semiconductor packages are connected in series between the first and the fourth wirings.

13. The semiconductor module according to claim 12, wherein a plurality of sets of the first semiconductor package and the second semiconductor package are provided.

14. The semiconductor module according to claim 12, wherein a thickness of at least one of the first wiring through the fifth wiring is equal to or more than 1 mm.

15. The semiconductor module according to claim 12, wherein the third and the fifth wirings have a L-shape.

16. The semiconductor module according to claim 12, wherein
 the fifth wiring has a plate shape.

17. The semiconductor module according to claim 1, wherein
 the material sealing the semiconductor element and the first and second main electrodes comprises a resin.

18. The semiconductor module according to claim 1, wherein
 the material sealing the first and second main electrodes and the semiconductor element contacts a side surface of the first main electrode, a top surface of the second main electrode, and a side surface of the second main electrode,
 a top surface of the first main electrode is exposed from the material at the top surface of the first semiconductor package, and
 a bottom surface of the second main electrode is exposed from the material at the bottom surface of the first semiconductor package.

* * * * *